United States Patent
Chen et al.

(10) Patent No.: US 9,762,236 B2
(45) Date of Patent: Sep. 12, 2017

(54) EMBEDDED BUTTON FOR AN ELECTRONIC DEVICE

(71) Applicant: UNEO Inc., Taipei (TW)

(72) Inventors: Cheng-Tsung Chen, Taipei (TW); Hsin-Lin Yu, Taipei (TW); Chih-Sheng Hou, Taipei (TW); Chia-Hung Chou, Taipei (TW)

(73) Assignee: UNEO INC., Taipei (TW)

( * ) Notice: Subject to any disclaimer, the term of this patent is extended or adjusted under 35 U.S.C. 154(b) by 128 days.

(21) Appl. No.: 14/611,307

(22) Filed: Feb. 2, 2015

(65) Prior Publication Data

US 2016/0225568 A1 Aug. 4, 2016

(51) Int. Cl.
*H01H 57/00* (2006.01)
*H03K 17/96* (2006.01)

(52) U.S. Cl.
CPC ................. *H03K 17/964* (2013.01)

(58) Field of Classification Search
CPC .. H01H 1/00; H01H 1/06; H01H 1/32; H01H 3/00; H01H 3/12; H01H 3/32; H01H 5/00; H01H 5/04; H01H 9/00; H01H 9/04; H01H 13/00; H01H 13/02; H01H 13/04; H01H 13/14; H01H 13/20; H01H 13/26; H01H 13/50; H01H 13/52; H01H 2003/00; H01H 2003/007; H01H 2003/02; H01H 2003/12; H01H 2009/04; H01H 2209/00; H01H 2209/004; H01H 2209/002; H01H 2209/046; H01H 2209/052; H01H 2209/056; H01H 2221/00; H01H 2221/002; H01H 2221/006; H01H 2221/074; H01H 2221/09; H01H 2223/00; H01H 2223/002; H01H 2223/04; H01H 2227/016; H01H 57/00; B32B 3/00; H01L 21/02; B26D 25/08; H03K 17/964; G04B 37/04; G04B 37/08; G04B 37/081; G04B 37/084; G04B 37/087
USPC .............. 200/181, 310; 296/1.08; 438/51
See application file for complete search history.

(56) References Cited

U.S. PATENT DOCUMENTS

| | | | | |
|---|---|---|---|---|
| 5,332,944 A * | 7/1994 | Cline | ............ | H03K 17/964 200/181 |
| 5,434,757 A * | 7/1995 | Kashiwagi | ............ | B60N 2/4693 200/314 |
| 6,879,088 B2 * | 4/2005 | Wong | ............ | H01H 29/18 200/188 |
| 2004/0159535 A1 * | 8/2004 | Wagner | ............ | H01H 13/702 200/512 |
| 2009/0058118 A1 * | 3/2009 | Hein | ............ | B60K 35/00 296/1.08 |

* cited by examiner

*Primary Examiner* — Anthony R. Jimenez
(74) *Attorney, Agent, or Firm* — Hauptman Ham, LLP

(57) ABSTRACT

An embedded button without having gap is disclosed according to the present invention. The button area just bends to operate instead of moving back and forth to operate within a through hole so that no water, vapor, or dust shall enter into the device. One of the embodiment comprises an inner bump configured on an inner side of an outer frame; a pressure switch is configured under the inner bump and touches the bottom surface of the bump; and an activating electrical signal is triggered when the button area is pressed by user with a force exceeding a threshold force level from outside surface of the outer frame of the electronic device.

29 Claims, 16 Drawing Sheets

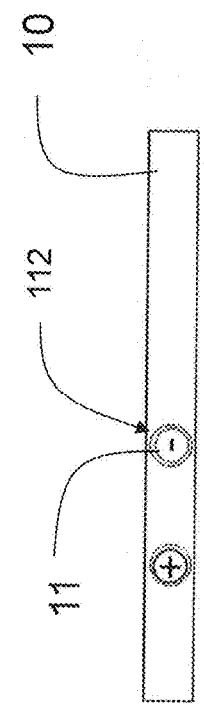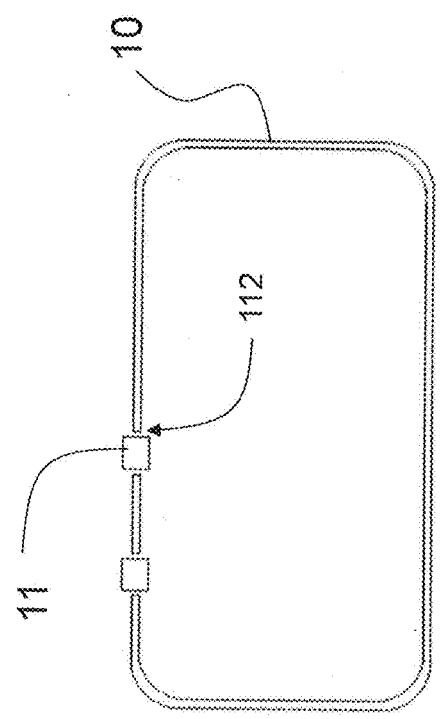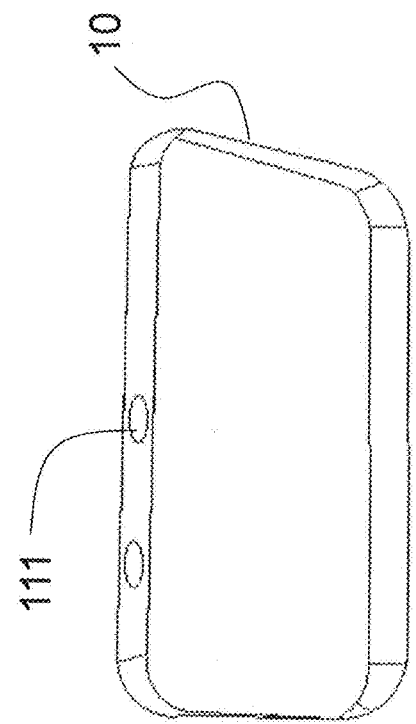

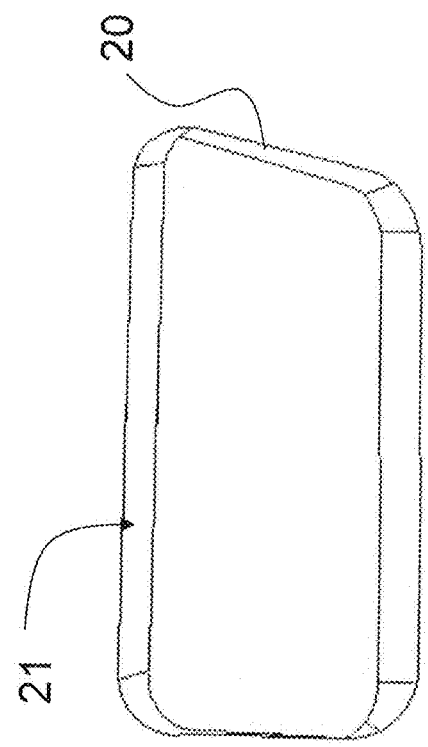
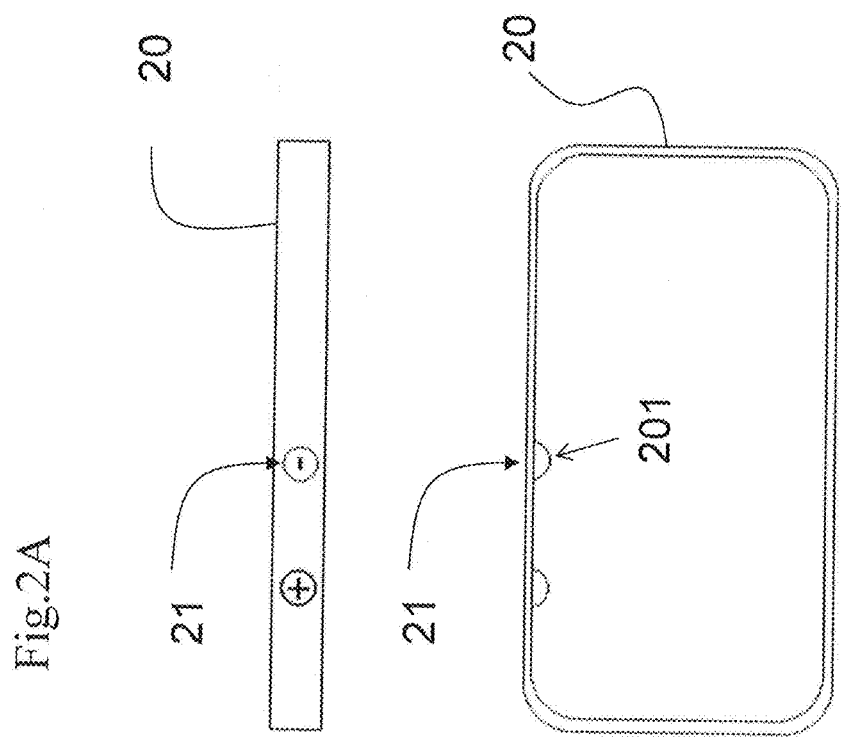
Fig.2A  Fig.2B  Fig.2C

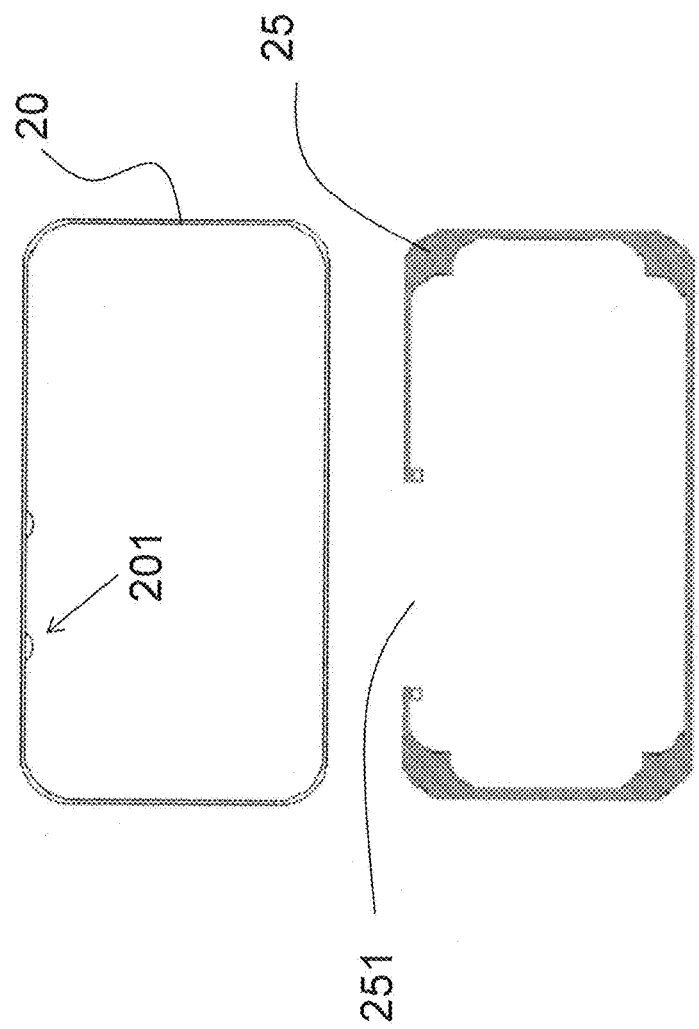

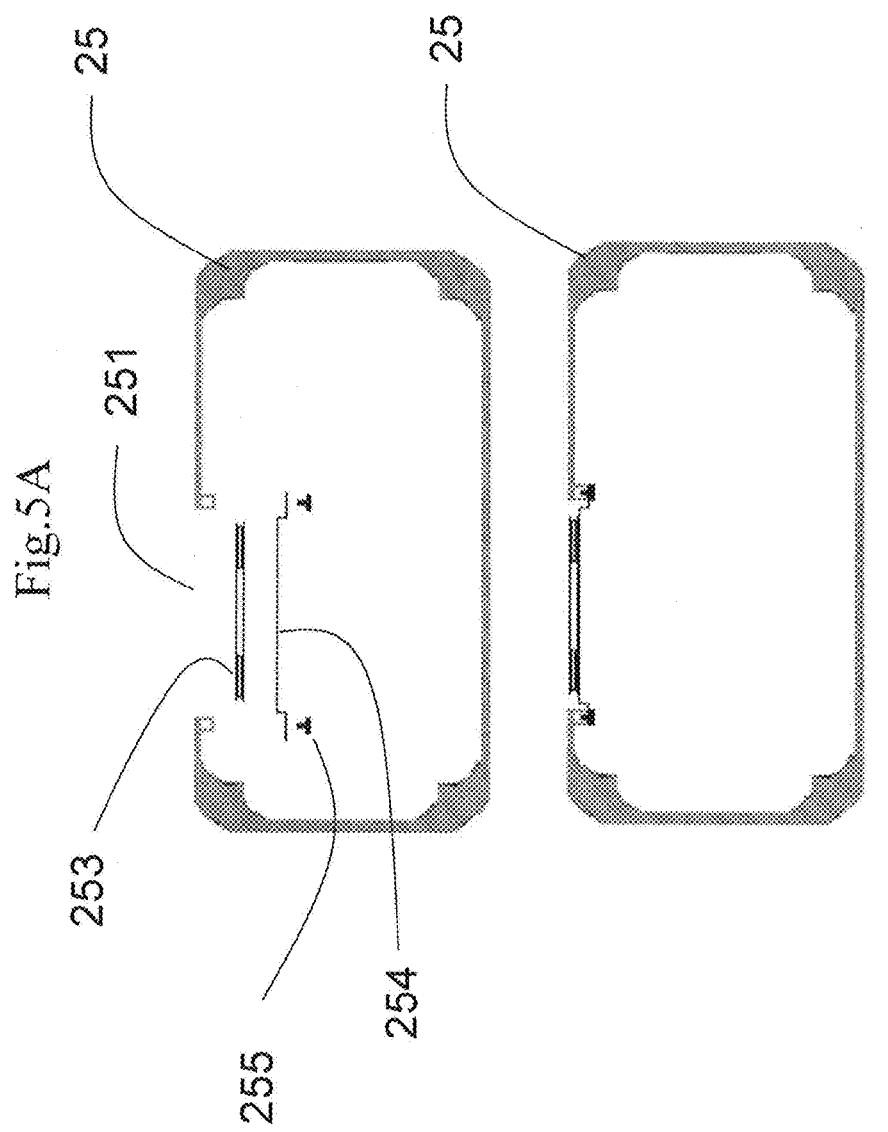

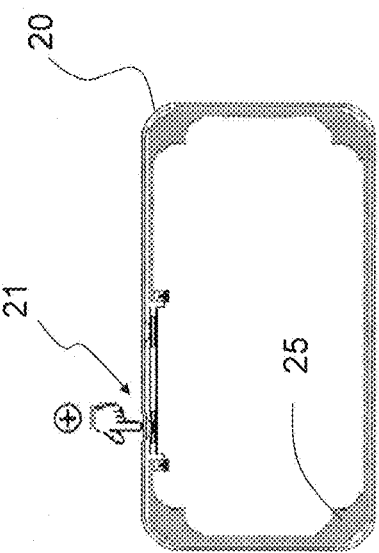
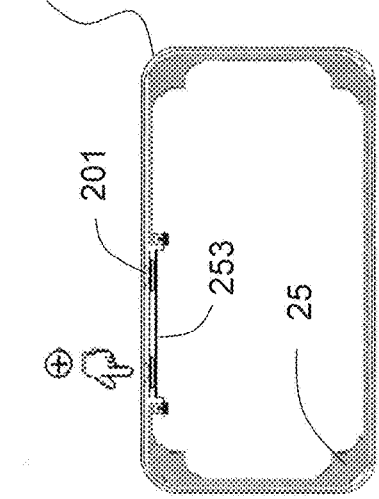

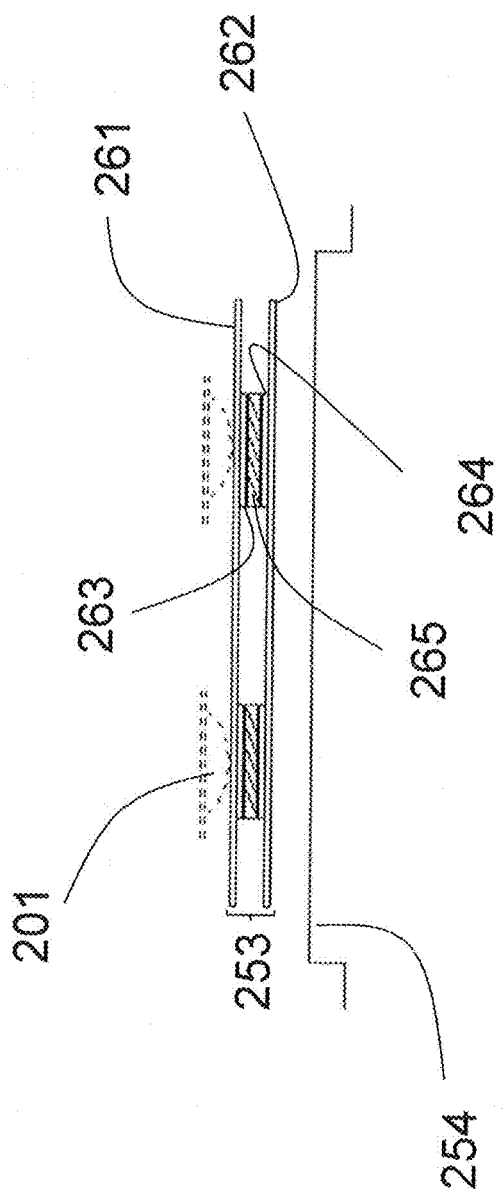

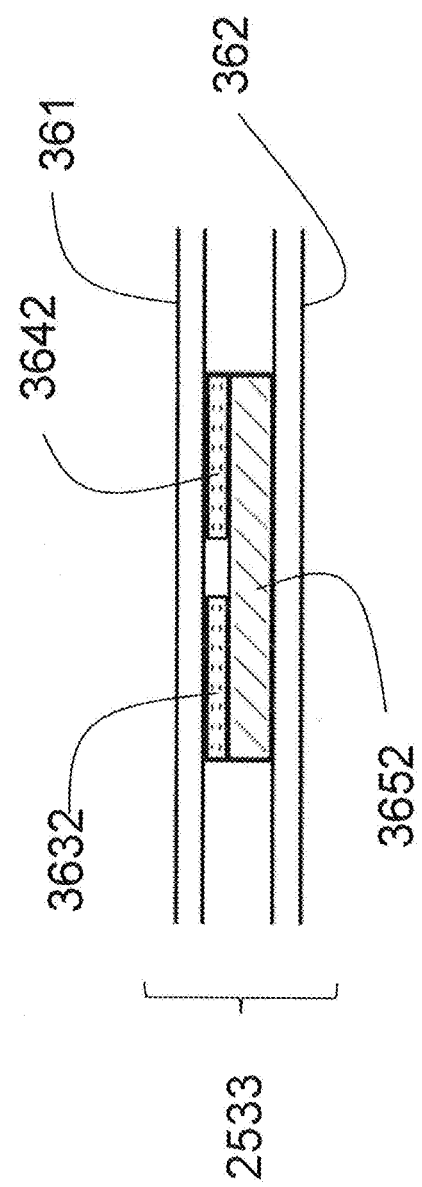

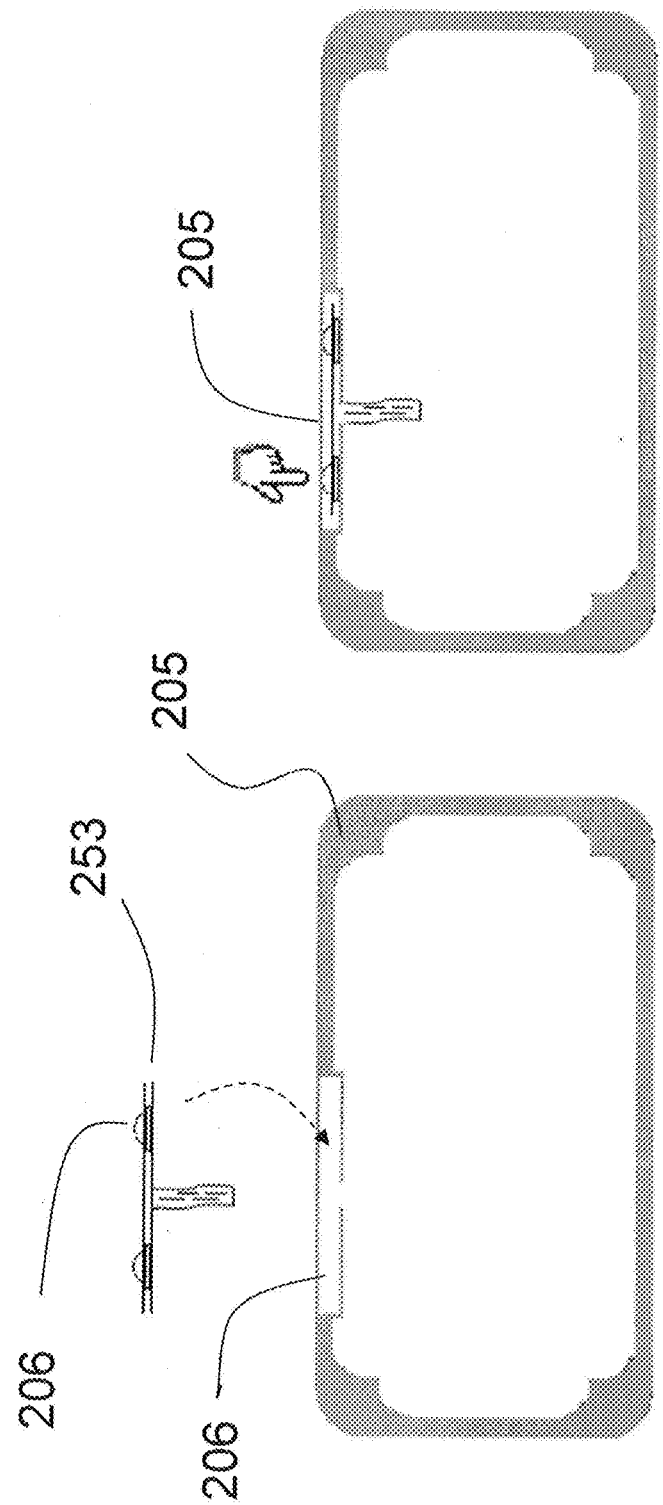

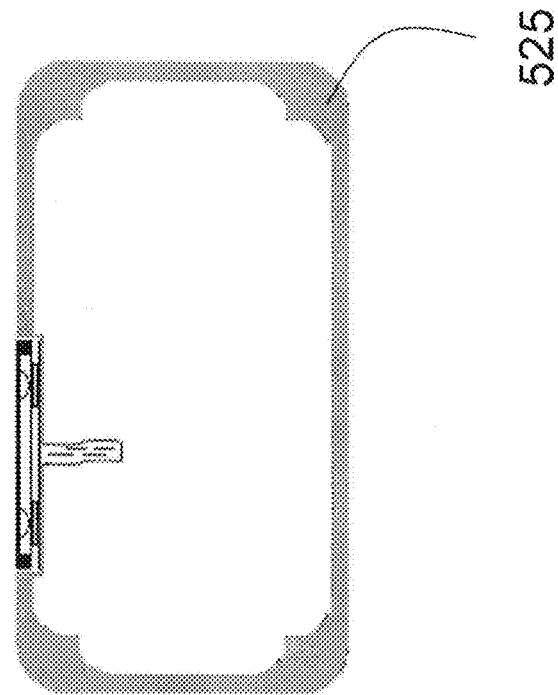
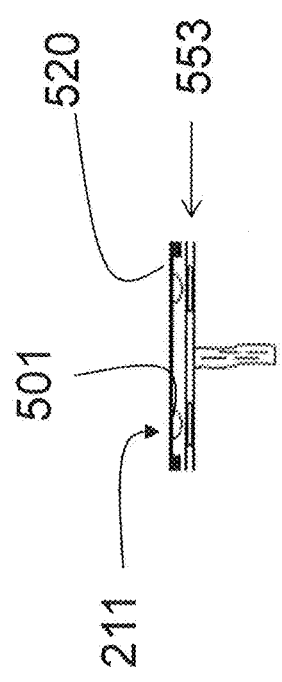
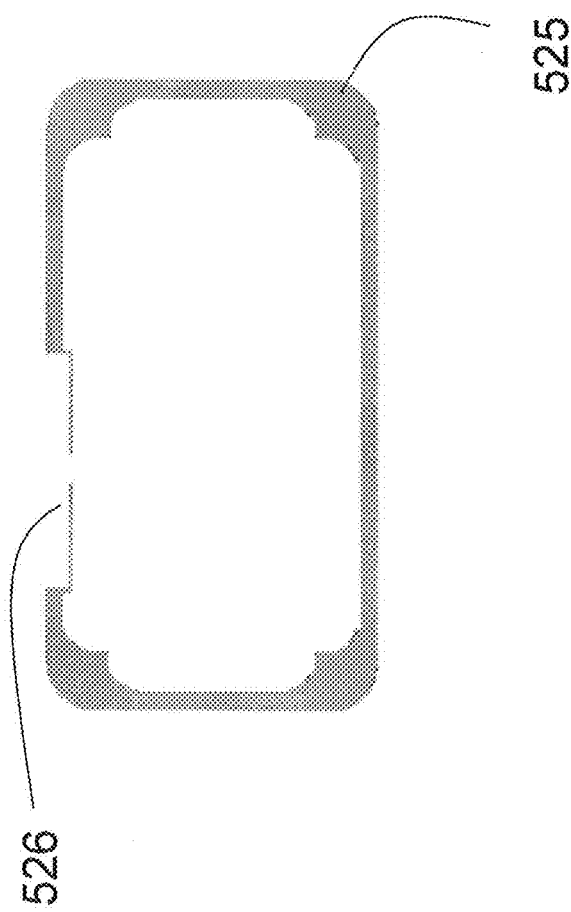
Fig.12A Fig.12B

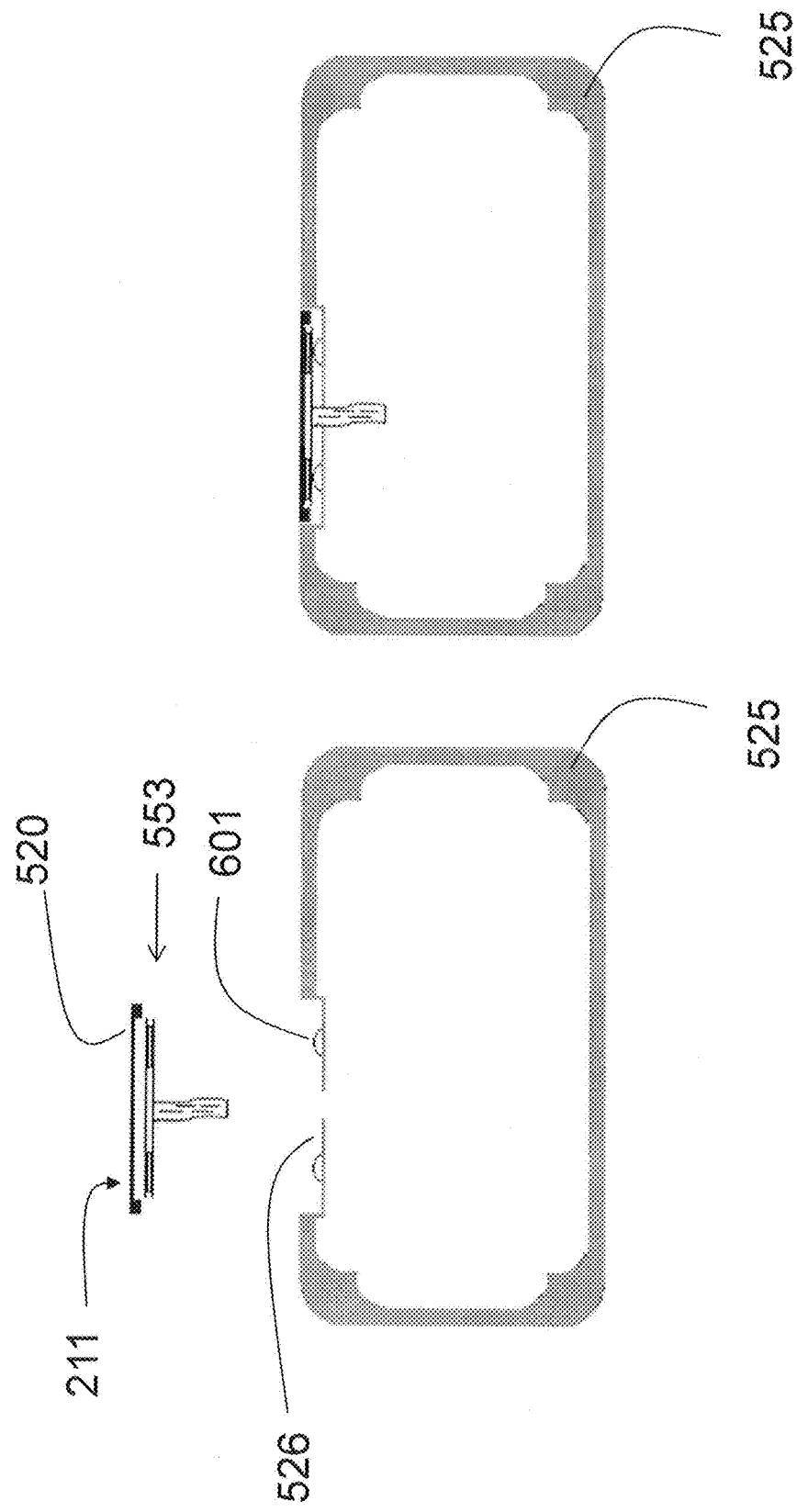

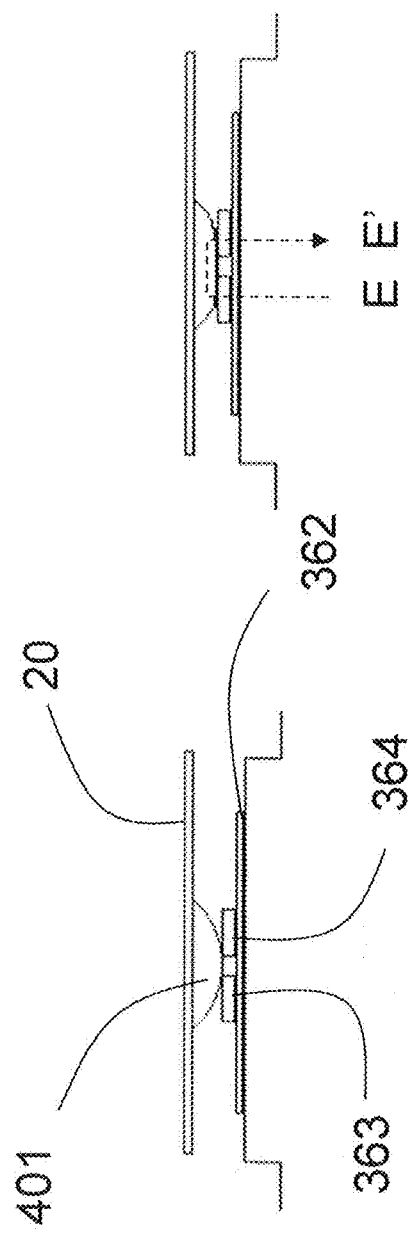

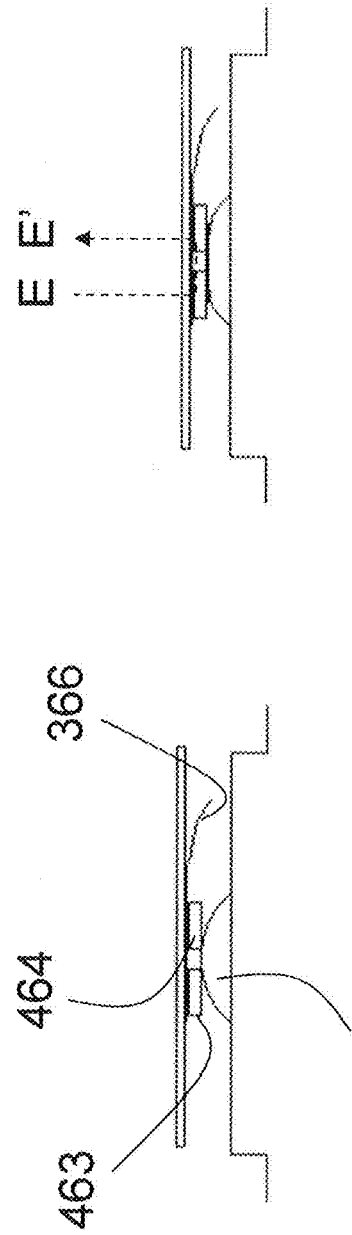

EMBEDDED BUTTON FOR AN ELECTRONIC DEVICE

BACKGROUND

Technical Field

The present invention relates to a button structure for an electronic device, especially for an embedded button without having a gap surrounding the button.

Description of Related Art

FIG. 1A~1C Shows a Prior Art

FIG. 1A shows that a side view of a mobile phone. A traditional physical button 11 is configured and passes through an outer frame 10 of a mobile phone. A gap 112 is configured in between the button 11 and the frame 10. In other word, the gap 112 surrounds the traditional physical button 11. The physical button 11 moves up and down when operated. The disadvantage for the gap 112 is that the gap 112 shall allow water, vapor, dust, etc., to enter into the device during operation of the button and could potentially break the phone.

FIG. 1B shows a section view of FIG. 1A. The physical button 11 has a height with a thickness thicker than the thickness of the outer frame 10. FIG. 1B shows the physical button 11 protrudes above a top surface of the outer frame 10, and the gap 112 surrounds The physical button 11.

FIG. 1C shows that a through hole 111 is made through the outer frame 10 for housing the physical button 11 to pass through for operation. The prior art shows that the physical button 11 may move up and down within the through hole 111 when operating. The repeated up and down operation of the physical button 11 may introduce contamination particles such as water, vapor, or dust into the device. The contamination particles cause damages to the device. A new design for the button to avoid contamination particles to enter the device during operation is highly desired.

BRIEF DESCRIPTION OF THE DRAWINGS

FIG. 1A~1C shows a prior art.

FIGS. 2A~2C show an outer frame for a first embodiment according to the present invention.

FIGS. 3A~3B show an outer frame and an inner frame for the first embodiment according to the present invention.

FIGS. 5A~5B shows a pressure switch configured for the first embodiment according to the present invention.

FIGS. 6A~6B show as first embodiment according to the present invention.

FIG. 7 shows a first structure for the pressure switch.

FIG. 10 shows a third structure for the pressure switch.

FIGS. 11A~11B shows a second embodiment according to the present invention.

FIGS. 12A~12B shows a third embodiment according to the present invention.

FIGS. 13A~13B shows a fourth embodiment according to the present invention.

FIGS. 15A~15B show a fifth structure for the pressure switch.

FIGS. 16A~16B show a sixth structure for the pressure switch.

DETAILED DESCRIPTION OF THE INVENTION

Figure 4:
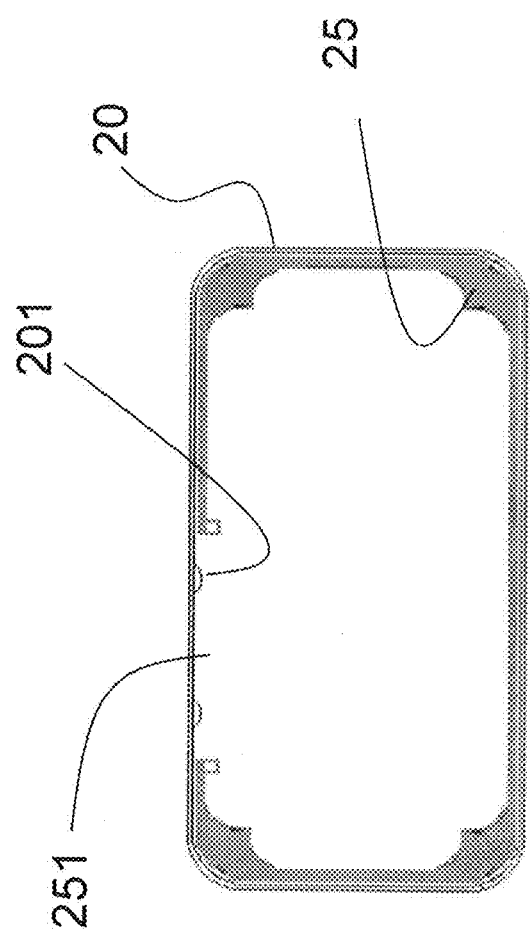
FIG. 4 shows the inner frame fitted inside the outer frame for the first embodiment according to the present invention.

An embedded button without having gap surrounding a button area is disclosed according to the present invention. The button area just bends to operate instead of moving back and forth to operate. No through hole surrounds the button area so that no water, water vapor, gaseous water, or dust . . . etc., shall enter into the device. The embedded button can be designed in any electronic device to operate; however a mobile phone is taken as an example for a description of the embedded button hereinafter according to the present invention.

FIGS. 2A~2C Show an Outer Frame for a First Embodiment According to the Present Invention FIG. 2A shows a side view of a mobile phone FIG. 2A shows that an embedded button for a mobile phone has an outer frame 20. A button area 21, a printed mark is shown for indicating a position to press, is configured on an outside surface of the outer frame 20. Since the button area 21 only shows an area to be depressible and no physical button exists, there is no gap surrounding the button area. In other words, there is no gap passing through the outer frame to link the outside and inside of the mobile phone.

FIG. 2B shows an inner bump configured inside the outer frame

FIG. 2B shows that an inner bump 201 is aligned with the button area 21 and is configured inside the outer frame 20.

FIG. 2C shows the outer frame has no gap surrounding the button area.

FIG. 2C shows that there is no gap surrounding the button area 21; i.e. no gap passing through the outer frame 20.

FIGS. 3A~3B Show an Outer Frame and an Inner Frame for the First Embodiment According to the Present Invention FIG. 3A shows an outer frame 20 of the mobile phone. At least one inner button 201 is configured inside the outer frame 20 and is aligned with the button area 21.

FIG. 3B shows an inner frame 25 of the mobile phone. The inner frame 25 is configured inside the outer frame 20. An opening 251 of the inner frame 25 is configured in a position encircling the inner bump 201 inside.

FIG. 4 Shows the Inner Frame Fitted Inside the Outer Frame for the First Embodiment According to the Present Invention FIG. 4 shows that the inner frame 25 fits inside the outer frame 20. The inner bump 201 is configured within the opening 251.

FIGS. 5A~5B Shows a Pressure Switch Configured for the First Embodiment According to the Present Invention FIG. 5A shows an exploded view where a pressure switch 253 is prepared to seat in a position within the opening 251. A support 254 is prepared to carry the pressure switch 253.

FIG. 5B shows the pressure switch 253 configured within the opening 251. The support 254 is fixed onto the inner frame 25 through screws 255 on the two ends of the support 254 in a section view.

FIGS. 6A~6B Show a First Embodiment According to the Present Invention

FIG. 6A shows that the pressure switch 253 has been well configured within the opening 251 and a top surface of the pressure switch 253 contacts a bottom surface of the inner bump 201. No activating electrical signal is generated from the pressure switch 253 in a first state (shown in FIG. 6A)

while no pressure is applied to the button area 21 from outside of the outer frame 20; an activating electrical signal is generated from the pressure switch 253 in a second state (shown in FIG. 6B) while the inner bump 201 is pressed against the pressure switch 253 due to a force exceeding a preset force threshold applied at the button area 21 from outside of the outer frame 20.

FIG. 6B shows in a second state that the button area 21 is pressed by a user from outside of the mobile phone so that the button area 21 is bended down to trigger an activating signal (not shown) for a further process. A surface movement for the button area 21 in a force direction has no more than 0.3 mm distance while the force applied at the button area.

FIG. 7 Shows a First Structure for the Pressure Switch

FIG. 7 shows that the pressure switch 253 includes a layer of piezo-sensitive electronic material 265 which is configured in between a top electrode 263 and a bottom electrode 264. Further a top flexible substrate 264 is configured on top of the top electrode 263; and a bottom flexible substrate 262 is configured on bottom of the bottom electrode 261. The piezo-sensitive electronic material 265 can be one of piezoelectric material, piezo-resistive material, or piezo-capacitive material.

Figure 8:
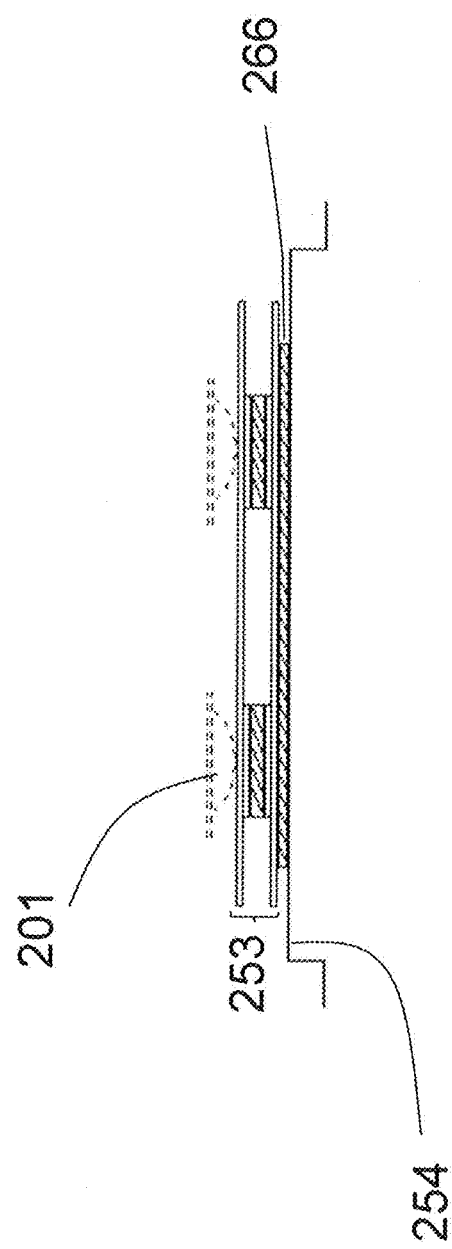
FIG. 8 shows a modified structure for the pressure switch.

FIG. 8 Shows a Modified Structure for the Pressure Switch

FIG. 8 shows that an elastic buffer layer 266 is configured on bottom of the pressure switch 253. The elastic buffer layer 266 provides the touch area 21 to bend more distance so that a better touch feeling shall be obtained. The elastic buffer layer 266 can be made of rubber or plastic.

Figure 9:
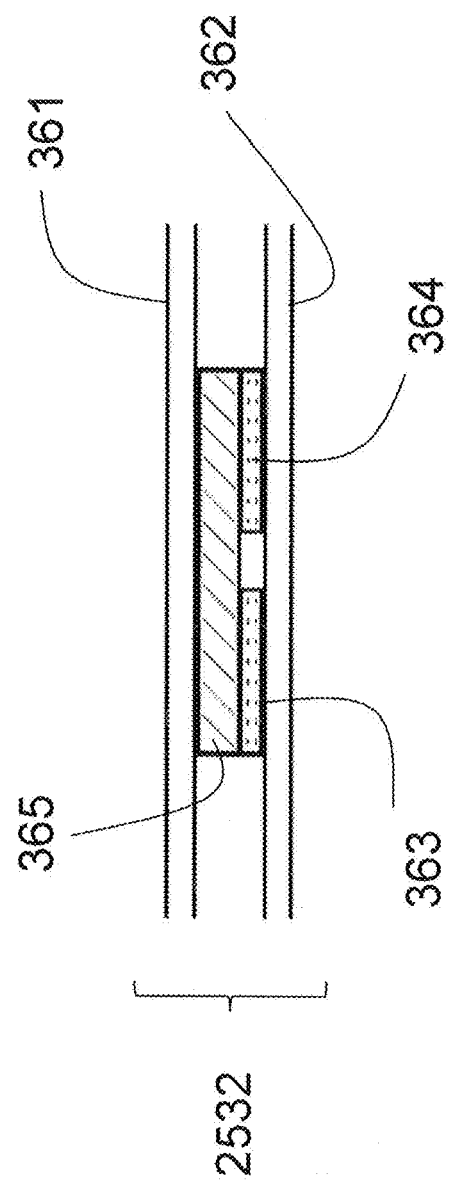
FIG. 9 shows a second structure for the pressure switch.

FIG. 9 Shows a Second Structure for the Pressure Switch

FIG. 9 shows that the pressure switch 2532 includes a layer of piezo-sensitive electronic material 365 which is configured on bottom of a top flexible substrate 361. A pair of coplanar electrodes 363, 364 is configured on bottom of the piezo-sensitive electronic material 365. A bottom flexible substrate 362 is configured on a bottom of the coplanar electrodes 363, 364.

FIG. 10 Shows a Third Structure for the Pressure Switch

FIG. 10 shows that the pressure switch 2533 includes a top flexible substrate 361. A pair of coplanar electrodes 3632, 3642 is configured on a bottom the top flexible substrate 361. A layer of piezo-sensitive electronic material 3652 is configured on bottom of the coplanar electrodes 3632, 3642. A bottom flexible substrate 362 is configured on bottom of the piezo-sensitive electronic material 3652.

FIGS. 11A~11B Shows a Second Embodiment According to the Present Invention FIG. 11A shows that the inner frame 25 and the outer frame 20 are integrated into a single unit. A bump 202 is formed on top of the pressure switch 253. A chamber 206 is formed in the integrated frame 205. The bump 202 with the pressure 253 is inserted into the chamber 206 from a lateral side of the frame 205.

FIG. 11B shows that the bump 202 with the pressure 253 has been seated in the chamber 206.

FIGS. 12A~12B Shows a Second Embodiment According to the Present Invention FIG. 12A shows that an embedded button for an electronic device includes a top plate 520. A button area 211, a printed mark is shown for instructing a position to press, is configured on a top surface of the top plate 520 without having a gap surrounding the button area 211. An inner bump 501 is aligned with the button area 211 and configured on a bottom surface of the top plate 520. A pressure switch 553 is configured on bottom of the bump contacting a bottom surface of the bump 501. A flexible circuit board 528 has a top end electrically coupled to the pressure switch 553, and a bottom end electrically coupled to a control unit (not shown). FIG. 12A shows that a frame 525 has a recess 526. The pressure switch 553 and the top plate 520 is prepared to put into the recess 526. A hole 527 is configured on bottom of the recess 526 such that a bottom end of the flexible circuit board 528 can pass through.

FIG. 12B shows that the top plate 520, bump 501, and pressure switch 553 have been inserted into the recess 526 from top.

FIGS. 13A~13B Shows a Fourth Embodiment According to the Present Invention FIG. 13A shows that an embedded button for a an electronic device includes a top plate 520. A button area 211, a printed mark to indicate a position to press, is configured on a top surface of the top plate 520 without having a gap surrounding the button area 211. A pressure switch 553 is configured on bottom of the top plate 520 and aligned with the button area 211. A frame 525 has a recess 526. The top plate 520 and the pressure switch 553 is prepared to be configured in the recess 526. A bump 601 is configured on top of a bottom surface of the recess 526 and aligned with the button area 211. A top of the bump 601 contacts a bottom of the pressure switch 553.

FIG. 13B shows that the top plate 520, pressure switch 553 have been inserted into the recess 526 from top.

Figure 14:
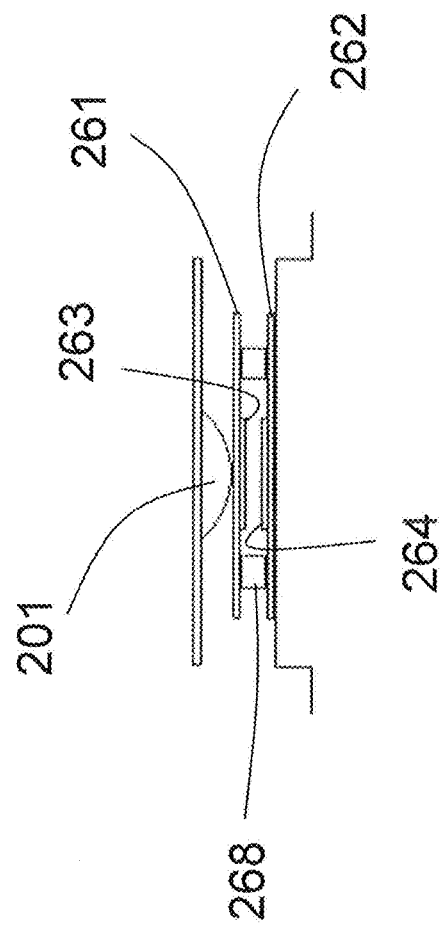
FIG. 14 shows a fourth structure for the pressure switch.

FIG. 14 Shows a Fourth Structure for the Pressure Switch

FIG. 14 shows a membrane switch which has a top electrode 263 and a bottom electrode 264. The top electrode 263 is configured on bottom of a top flexible circuit board 261 and a bottom electrode 264 is configured on top of a bottom flexible circuit board 262. A spacer 268 is configured between the top flexible circuit board 261 and the bottom circuit board 262.

FIGS. 15A~15B Shows a Fifth Structure for the Pressure Switch

FIG. 15A shows that a piezo bump 401 is configured on bottom of the outer frame 20. A left electrode 363 and a right electrode 364 are made coplanar and made on top of a bottom flexible circuit board 362. The pair of electrodes 363, 364 is configured on bottom of the inner bump 201. The piezo bump 401 is made of a material selected from a group consisting of piezo-electric material, piezo-resistive material and piezo-capacitive material.

FIG. 15B shows a status when the inner bump is depressed

FIG. 15B shows that the piezo bump 401 is depressed and deformed on top of the left electrode 363 and a right electrode 364. At this moment, a change in current or voltage occurs in the path EE' and a corresponding signal is generated for a further process.

FIGS. 16A~16B Shows a Sixth Structure for the Pressure Switch

FIG. 16A shows a flexible circuit 366 is configured on bottom of the outer frame. A left electrode 463 and a right electrode 464 are made coplanar and made on bottom of the circuit board 366. A piezo bump 401 is configured on bottom of the pair of electrodes 363, 364.

FIG. 16B shows a status when the button area is depressed

FIG. 16B shows that the button area is depressed from top. The piezo bump 401 is deformed to contact both the left electrode 463 and a right electrode 464. At this moment, a change in current or voltage occurs in the path EE' and a corresponding signal is generated for further process.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. An embedded button for an electronic device, the embedded button comprising:
    an inner frame having four side walls connected to each other to extend around a middle region of the electronic device;
    an outer frame having four side walls connected to each other to extend around the inner frame which is fitted inside the outer frame, wherein each side wall among the four side walls of the outer frame extends along a corresponding side wall among the four side walls of the inner frame;
    a button area on an outside surface of a first side wall among the four side walls of the outer frame without having a gap surrounding the button area;
    an inner bump inside the outer frame and aligned with the button area; and
    a pressure switch on bottom of the inner bump and contacting a bottom surface of the inner bump; wherein
    no activating electrical signal is generated from the pressure switch in a first state while no pressure is applied to the button area from outside of the outer frame; and
    an activating electrical signal is generated from the pressure switch in a second state while the inner bump is pressed against the pressure switch due to a force exceeding a preset force threshold applied at the button area from outside of the outer frame.

2. The embedded button as claimed in claim 1, further comprising:
    a support carrying the pressure switch and having ends fixed onto the inner frame, wherein
    the inner frame has, among the four side walls of the inner frame, a second side wall along which the first side wall of the outer frame extends,
    the second side wall of the inner frame has an opening corresponding to the button area,
    the pressure switch is arranged inside the opening, and has opposite first and second surfaces, the first surface in contact with the bottom surface of the inner bump, the second surface in contact with a middle section of the support,
    the middle section of the support is located between the ends of the support, and
    each of the ends of the support has an L shape, the L shape having
        a first part extending from the middle section of the support toward the middle region of the electronic device, and
        a second part extending at an angle from the first part, and being fixed to the inner frame.

3. The embedded button as claimed in claim 1, wherein a surface movement of the button area in a force direction of the force is no more than 0.3 mm while the force is applied at the button area.

4. The embedded button as claimed in claim 1, wherein the pressure switch is a membrane switch.

5. The embedded button as claimed in claim 1, wherein the pressure switch comprises:
    a top electrode;
    a piezo-sensitive electronic material on bottom of the top electrode; and
    a bottom electrode on bottom of the piezo-sensitive electronic material.

6. The embedded button as claimed in claim 5, further comprising:
    a top flexible substrate on top of and in contact with the top electrode, wherein the top flexible substrate is in contact with the bottom surface of the inner bump; and
    a bottom flexible substrate on bottom of and in contact with the bottom electrode.

7. The embedded button as claimed in claim 5, wherein the piezo-sensitive electronic material is selected from the group consisting of piezo-electric material, piezo-resistive material, and piezo-capacitive material.

8. The embedded button as claimed in claim 1, further comprising:
    an elastic buffer layer on bottom of the pressure switch.

9. The embedded button as claimed in claim 8, wherein the elastic buffer layer is selected from the group consisting of rubber and plastic.

10. The embedded button as claimed in claim 8, further comprising:
    a support on bottom of the elastic buffer layer and having ends fixed onto the inner frame, wherein
    the inner frame has, among the four side walls of the inner frame, a second side wall along which the first side wall of the outer frame extends,
    the second side wall of the inner frame has an opening corresponding to the button area,
    the pressure switch is arranged inside the opening, and has opposite first and second surfaces, the first surface in contact with the bottom surface of the inner bump, the second surface in contact with the elastic buffer layer,
    the elastic buffer layer is sandwiched between the pressure switch and a middle section of the support,
    the middle section of the support is located between the ends of the support, and
    each of the ends of the support has an L shape, the L shape having
        a first part extending from the middle section of the support toward the middle region of the electronic device, and
        a second part extending at an angle from the first part, and being fixed to the inner frame.

11. The embedded button as claimed in claim 10, wherein the elastic buffer layer is selected from the group consisting of rubber and plastic.

12. The embedded button as claimed in claim 1, wherein the pressure switch comprises:
    a piezo-sensitive electronic material; and
    a pair of coplanar electrodes on bottom of and in contact with the piezo-sensitive electronic material.

13. The embedded button as claimed in claim 12, wherein the piezo-sensitive electronic material is selected from the group consisting of piezo-electric material, piezo-resistive material, and piezo-capacitive material.

14. The embedded button as claimed in claim 12, further comprising:
    a top flexible substrate on top of and in contact with the piezo-sensitive electronic material, wherein the top flexible substrate is in contact with the bottom surface of the inner bump; and
    a bottom flexible substrate on bottom of and in contact with the coplanar electrodes.

15. The embedded button as claimed in claim 14, further comprising:
    an elastic buffer layer on bottom of and in contact with the bottom flexible substrate.

16. The embedded button as claimed in claim 15, wherein the elastic buffer layer is selected from the group consisting of rubber and plastic.

17. The embedded button as claimed in claim 1, wherein the pressure switch comprises:
   a pair of coplanar electrodes; and
   a piezo-sensitive electronic material on bottom of the coplanar electrodes.

18. The embedded button as claimed in claim 17, wherein the piezo-sensitive electronic material is selected from the group consisting of piezo-electric material, piezo-resistive material, and piezo-capacitive material.

19. The embedded button as claimed in claim 17, further comprising:
   a top flexible substrate on top of and in contact with the coplanar electrodes, wherein the top flexible substrate is in contact with the bottom surface of the inner bump; and
   a bottom flexible substrate on bottom of and in contact with the piezo-sensitive electronic material.

20. The embedded button as claimed in claim 19, further comprising:
   an elastic buffer layer on bottom of and in contact with the bottom flexible substrate.

21. The embedded button as claimed in claim 20, wherein the elastic buffer layer is selected from the group consisting of rubber and plastic.

22. An embedded button for an electronic device, the embedded button comprising:
   a frame having four side walls connected to each other to extend around a middle region of the electronic device;
   a chamber formed in one side wall among the four side walls of the frame, the chamber being in contact with only the one side wall;
   a button area on an outside surface of said one side wall without having a gap surrounding the button area, the button area corresponding to a top of the chamber;
   an inner bump in the chamber and aligned with the button area; and
   a pressure switch in the chamber, on bottom of the inner bump, and contacting a bottom surface of the inner bump; wherein
   no activating electrical signal is generated from the pressure switch in a first state while no pressure is applied to the button area from outside of the frame; and
   an activating electrical signal is generated from the pressure switch in a second state while the inner bump is pressed against the pressure switch due to a force exceeding a preset force threshold applied at the button area from outside of the frame.

23. The embedded button as claimed in claim 22, further comprising:
   a flexible circuit board having
      a top end electrically coupled to the pressure switch, and
      a bottom end extending through a hole in a bottom of the chamber into the middle region of the electronic device.

24. An embedded button for an electronic device, the embedded button comprising:
   a top plate;
   a button area on a top surface of the top plate without having a gap surrounding the button area;
   a pressure switch on bottom of the top plate and aligned with the button area;
   a bump contacting the pressure switch and aligned with the button area; and
   a frame having
      four side walls connected to each other to extend around a middle region of the electronic device, and
      a recess in one side wall among the four side walls, wherein
   the top plate, the bump and the pressure switch are arranged in the recess; wherein
   no activating electrical signal is generated from the pressure switch in a first state while no pressure is applied to the button area from outside of the top plate; and
   an activating electrical signal is generated from the pressure switch in a second state while the bump is pressed against the pressure switch due to a force exceeding a preset force threshold applied at the button area from outside of the top plate.

25. The embedded button as claimed in claim 24, further comprising:
   a flexible circuit board having
      a top end electrically coupled to the pressure switch, and
      a bottom end extending through a hole in a bottom of the recess into the middle region of the electronic device.

26. The embedded button as claimed in claim 25, wherein the bump is arranged between the top plate and the pressure switch, and the pressure switch is arranged between the bump and the bottom of the recess.

27. The embedded button as claimed in claim 25, wherein the pressure switch is arranged between the top plate and the bump, and the bump is arranged between the pressure switch and the bottom of the recess.

28. An embedded button for an electronic device, the embedded button comprising:
   an outer frame having four side walls connected to each other to extend around a middle region of the electronic device;
   a button area on an outside surface of one side wall among the four side walls of the outer frame without having a gap surrounding the button area;
   a piezo bump on an inside surface of said one side wall and aligned with the button area; and
   a pair of coplanar electrodes on bottom of and in contact with the piezo bump; wherein
   no activating electrical signal is generated in a first state while no pressure is applied to the button area from outside of the outer frame; and
   an activating electrical signal is generated in a second state while the piezo bump is pressed against the coplanar electrodes due to a force exceeding a preset force threshold applied at the button area from outside of the outer frame.

29. An embedded button for an electronic device, the embedded button comprising:
   an outer frame having four side walls connected to each other to extend around a middle region of the electronic device;
   a button area on an outside surface of one side wall among the four side walls of the outer frame without having a gap surrounding the button area;
   a flexible circuit board on an inside surface of said one side wall;
   a pair of coplanar electrodes on bottom of the flexible circuit board and aligned with the button area; and
   a piezo bump on bottom of and in contact with the coplanar electrodes; wherein no activating electrical signal is generated in a first state while no pressure is applied to the button area from outside of the outer frame; and an activating electrical signal is generated in a second state while the piezo bump is pressed against the coplanar electrodes due to a force exceeding a preset force threshold applied at the button area from outside of the outer frame.

* * * * *